(12) United States Patent
Fielder et al.

(10) Patent No.: US 8,745,868 B2
(45) Date of Patent: Jun. 10, 2014

(54) METHOD FOR HYDROPHILIZING SURFACES OF A PRINT HEAD ASSEMBLY

(75) Inventors: Simon Fielder, Balmain (AU); Lewis Matich, Balmain (AU); Kia Silverbrook, Balmain (AU)

(73) Assignee: Zamtec Ltd, Dublin (IE)

( * ) Notice: Subject to any disclaimer, the term of this patent is extended or adjusted under 35 U.S.C. 154(b) by 758 days.

(21) Appl. No.: 12/794,777

(22) Filed: Jun. 7, 2010

(65) Prior Publication Data
US 2011/0296688 A1 Dec. 8, 2011

(51) Int. Cl.
*B41J 2/16* (2006.01)

(52) U.S. Cl.
USPC ............... 29/890.1; 29/593; 347/47; 427/301

(58) Field of Classification Search
USPC ............ 29/890.1, 594, 25.35, 830, 593; 427/301, 302, 333, 303; 347/37, 40, 347/45–47; 521/905; 428/457
See application file for complete search history.

(56) References Cited

U.S. PATENT DOCUMENTS

| | | | |
|---|---|---|---|
| 3,975,350 A * | 8/1976 | Hudgin et al. | 521/905 X |
| 5,975,677 A * | 11/1999 | Marler et al. | 347/40 |
| 6,123,994 A * | 9/2000 | Ito et al. | 427/333 |
| 6,342,275 B1 | 1/2002 | Miyakawa et al. | |
| 6,789,876 B2 * | 9/2004 | Barclay et al. | 347/37 |
| 2004/0001957 A1* | 1/2004 | Seita et al. | 428/457 |
| 2005/0190231 A1* | 9/2005 | Lim et al. | 347/45 |

FOREIGN PATENT DOCUMENTS

JP 05124200 A * 5/1993

* cited by examiner

*Primary Examiner* — A. Dexter Tugbang
(74) *Attorney, Agent, or Firm* — Cooley LLP (57) ABSTRACT

A method for hydrophilizing surfaces of a printhead assembly includes decontaminating the printhead assembly; plasma activating the surfaces of the printhead assembly; treating the surfaces of the printhead assembly with a treatment solution; drying the printhead assembly; baking the printhead assembly; and performing a print quality and electrical test on the printhead assembly. The step of decontaminating the printhead assembly is performed before the step of plasma activating the surfaces of the printhead assembly.

16 Claims, 5 Drawing Sheets

METHOD FOR HYDROPHILIZING SURFACES OF A PRINT HEAD ASSEMBLY

FIELD OF INVENTION

The disclosed invention relates to a method for hydrophilizing surfaces of a print head assembly with plasma at atmospheric pressure. Further, the disclosed invention relates to a method for treating the hydrophilized surfaces to extend the hydrophilic lifetime of the internal surfaces.

CROSS REFERENCES

The following patents or patent applications filed by the applicant or assignee of the present invention are hereby incorporated by cross-reference.

| | | | | | | |
|---|---|---|---|---|---|---|
| 7,645,034 | 7,637,602 | 7,645,033 | 7,661,803 | 11/677,049 | 11/677,050 | 7,658,482 |
| 11,872,719 | 11,872,718 | 12,046,449 | 12,062,514 | 12,062,517 | 12,062,518 | 12,062,520 |
| 12,062,521 | 12,062,522 | 12,062,523 | 12,062,524 | 12,062,525 | 12,062,526 | 12,062,527 |
| 12,062,528 | 12,062,529 | 12,062,530 | 12,062,531 | 12,192,116 | 12,192,117 | 12,192,118 |
| 12,192,119 | 12,192,120 | 12,192,121 | | | | |

BACKGROUND

Print head assemblies typically include a print head, one or more ink paths for supplying ink to the print head, and drive circuitry for driving the print head. During the operation of conventional print head assemblies, there has been observed a phenomenon where bubbles form on the surfaces of the ink paths and in the print head as ink flows therethrough. The formation of such bubbles causes blockages in the ink flow, reduces the wettability of the surfaces, and degrades print quality.

To ameliorate this problem, the surfaces of a print head assembly may be activated with a plasma species during or after fabrication. Plasma activation of the internal surfaces of the print head assembly renders these surfaces more hydrophilic and increases their wettability; this in turn inhibits bubble formation.

The hydrophilic characteristics conveyed to surfaces by plasma activation, however, degrade or relax with time. In the case of print head assemblies, one solution for ameliorating this problem is to prime the print head assemblies with ink, or an ink like fluid, after the surfaces thereof have been plasma activated, and to ensure that the print head assemblies remain primed with ink (or the ink like fluid) until they are used. Keeping a print head assembly primed with ink, or an ink like fluid, from the time of production until the time of use, however, introduces significant complexities, including the storage and transport of such primed print head assemblies.

Another solution for retarding the relaxation of plasma activated surfaces is to treat the activated surfaces with a polyethyleneimine (PEI) solution. According to the current understanding in the art, PEI relies predominantly on the formation of intramolecular carboxyl bonds with the activated surfaces. PEI is therefore less effective when used on surfaces activated with a plasma other than a carbon dioxide plasma.

U.S. Pat. No. 5,700,559, U.S. Pat. No. 5,807,636, and U.S. Pat. No. 5,837,377 describe a hydrophilic article for use in aqueous environments, including a substrate, an ionic polymeric layer on said substrate, and a disordered polyelectrolyte coating ionically bonded to said polymeric layer.

The plasma activation of a print head assembly is conventionally performed using a vacuum plasma processing method. Vacuum plasma processing methods, however, are expensive and time consuming. A vacuum plasma processing method requires costly and specialised equipment to create a vacuum and to generate a plasma within the vacuum. Further, significant time is required for loading and unloading a work piece into/from a vacuum chamber, creating and releasing the vacuum, and allowing the plasma to diffused through and activate the work piece.

A further disadvantage associated with vacuum plasma processing is that vacuum plasma processing is indiscriminate insofar as which surfaces of the work piece are activated, and to what extent they are activated. Directed activation of specific surfaces is generally difficult to achieve and the selective activation of internal surfaces alone is impossible.

Still further, the vacuum plasma processing method does not compliment serial/assembly-line type production process commonly used in the fabrication of print head assemblies. To enable the vacuum plasma process to be cost feasible, print head assemblies are processed in batches. The collation and later de-collation of print head assemblies into batches for vacuum plasma processing interrupts the work flow of serial, assembly-line type production processes and reduces the efficiency of the production process.

Quality control issues also arise from the discontinuity caused by the batch processing of print head assemblies for vacuum plasma processing. A first print head assembly removed from a vacuum processing batch and a last print head assembly removed from the same batch vary in age. For example, a print head assembly removed first from the batch exiting the vacuum plasma process has an active surface that is "younger" than a print head assembly removed last from the same batch. Such differences in age affect the results of further processing steps performed downstream of the vacuum plasma processing step.

SUMMARY

According to an aspect of the present disclosure, a method for hydrophilizing surfaces of a printhead assembly includes decontaminating the printhead assembly; plasma activating the surfaces of the printhead assembly; treating the surfaces of the printhead assembly with a treatment solution; drying the printhead assembly; baking the printhead assembly; and performing a print quality and electrical test on the printhead assembly. The step of decontaminating the printhead assembly is performed before the step of plasma activating the surfaces of the printhead assembly.

DETAILED DESCRIPTION

Plasma activating a substrate increases the surface energy of the substrate surface through the generation of active chemical species, thereby imparting greater hydrophilic character to the substrate surface. The active species formed at the surface are, however, of a higher energy relative to either an untreated surface or the bulk phase beneath the surface. Thermodynamically, this is unfavourable and the system will seek to minimise this energy. Such a process is known as relaxation.

Adsorption and reaction with atmospheric species is commonly credited for the observed relaxation of hard surfaces such as silicon and silicon dioxide. In the case of soft materials, such as plastics, a form of molecular subduction where chemically active species are folded back into the bulk phase of the plastic, thereby returning the surface to a state very close to that of its untreated form, is commonly credited as the relaxation mechanism.

In a print head assembly that is composed of a composite of different materials, some surfaces of the assembly, such as the glue joins, are intrinsically more hydrophobic than other surfaces. These more hydrophobic surfaces wet less efficiently and, more importantly, de-wet more readily. Moreover, the rates of relaxation amongst different surfaces of the print head assembly may vary greatly.

While plasma activation does not generate a uniform surface energy over the composite of materials making up the print head assembly, the surfaces of a print head assembly have the maximum degree of surface energy and uniformity of surface energy immediately after these surfaces have been subjected to plasma activation.

In the present invention, a print head assembly is subjected to plasma activation at atmospheric pressure to activate the internal surfaces thereof. Following the plasma activation of the surfaces, the surfaces are treated with an ethoxylated polyethyleneimine (EPI) solution. The treatment process involving EPI leaves behind a non-volatile, highly wetting, thin film of EPI that extends the time over which the activated surface remains hydrophilic.

Figure 5A:
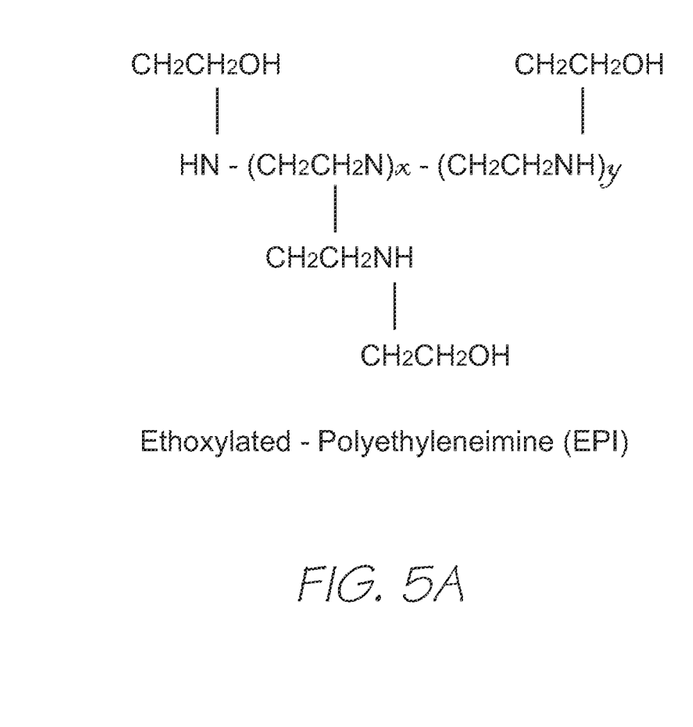
FIG. 5A illustrates a chemical structure of ethoxylated polyethyleneimine (EPI)
Figure 5B:
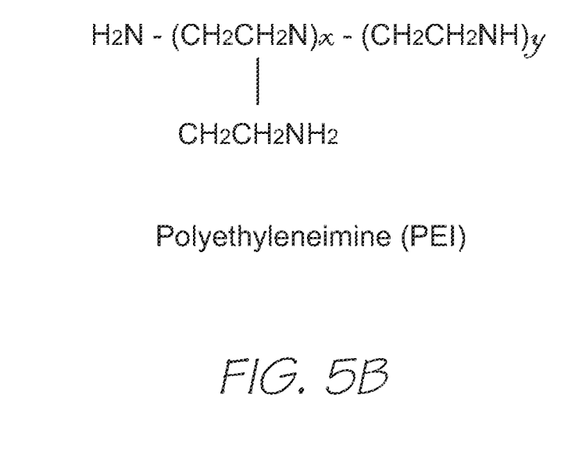
FIG. 5B illustrates a chemical structure of polyethyleneimine (PEI).

FIG. 5A illustrates a formula of EPI, and FIG. 5B illustrates a formula of a polyethyleneimine (PEI). At the time of invention, it was generally understood in the art that exposure of a surface activated with a carbon dioxide plasma to a solution of PEI resulted in the formation of an extensive and tightly bound salt complex between the amino functionality of the PEI and the acidic carboxyl groups on the surface formed during plasma processing with the carbon dioxide.

According to the general understanding in the art, the reactivity with which the amino groups of the PEI molecules and the carboxyl groups of the carbon dioxide activated surface interact with each other controlled both the formation and subsequent stability of the salt complex. The higher the proportion of primary amino functionality within the PEI molecule that is accessible by the carboxyl groups, the higher the quality and robustness of the resultant surface layer. Conversely, the higher the steric encumbrance of the amino functionality within the PEI molecules, the less effective the treatment and the quality of the hydrophilic layer that is formed from it.

Significantly, the above implies that functionalised PEI derivatives, where the derivative does not contribute to any macromolecular salt formation, would yield less robust and relatively inferior hydrophilic surfaces. The number of primary amino groups in an Ethoxylated-PEI (i.e. EPI), for example, is substantially reduced relative to its parent polymer (PEI) and, at 80% ethoxylation, the amino functionality of EPI is on average far more encumbered sterically than the parent (PEI). Furthermore, since ethoxylation introduces a functional group that does not participate in salt formation it would be expected that EPI would prove to be a less effective agent than PEI for the hydrophiliization of a carboxylated surface.

Contrary to the general understanding in the art, the inventors of the present invention found that treatment of an activated surface with EPI formed a superior hydrophilic film compared to that of PEI. The inventors of the present invention suggests that the mechanism of adhesion is through an extensive network of weaker, yet equally prolific, hydrogen bonds rather than salt formation.

In the present invention therefore, EPI is used as a superior alternative to PEI to treat the plasma activated surfaces and in particular the plasma activated surfaces of a print head assembly.

Treating an activated surface with EPI forms superior hydrophilic films on the activated surface, as compared to a PEI treatment. The use of EPI over PEI is inconsistent with accepted understanding in the art regarding the stabilizing interactions that occur between PEI and an activated surface, whereby accepted understanding suggests that EPI would be inferior to PEI.

Figure 1:
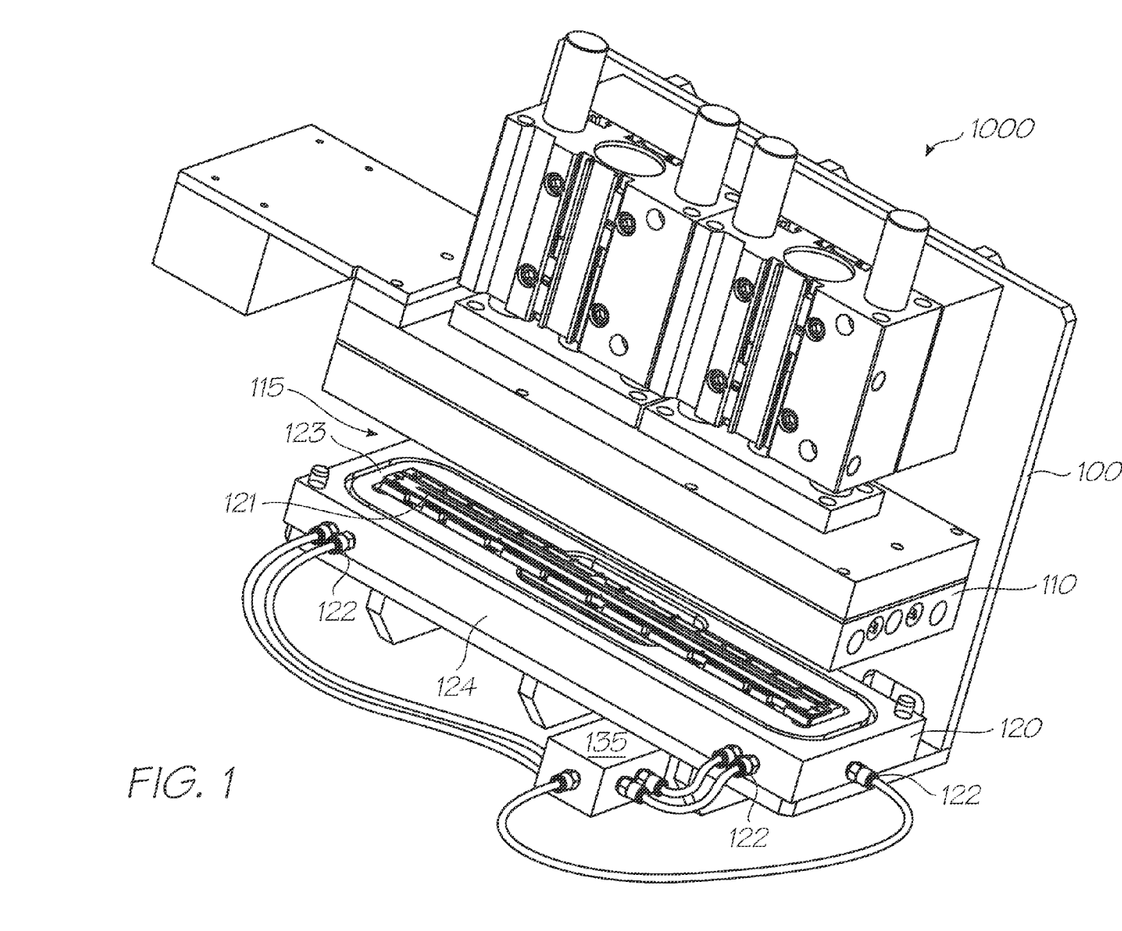
FIG. 1 is a schematic illustration of an exemplary setup used for plasma activation of a printhead assembly.

FIG. 1 schematically illustrates an exemplary setup (1000) of one embodiment of the present invention.

The setup (1000) includes a plasma source (110) for supplying plasma to a plasma receiving area (115), and a print head assembly (120) received in a jig (100) so as to be positioned within the plasma receiving area (115). The print head assembly includes nozzles (121) defined through a first surface (123) of the print head assembly, and spigots (122) attached to a second surface (124) of the print head assembly. The spigots (122) are, for example, the ink supply inlets and/or connectors of the print head assembly (120) that connect a print head of the print head assembly (12) to a supply of ink, for example, an ink reservoir or ink supply channel. The setup (1000) further includes a pressure differential established across the plasma receiving area (115), and in particular across the first surface (123) and the second surface (124).

The pressure differential is established, in one embodiment, by a suction pump (135) connected to the spigots (122). As an alternative, or in addition to, the suction pump (135), a blower is provided on the side of the plasma source (110) and directed towards the nozzles (121).

The plasma source (110) is an atmospheric pressure generation device, and is directed towards the plasma receiving area (115) and the nozzles (121). By using an atmospheric plasma source, the print head assembly (120) is activated in an environment at or close to atmospheric pressure. This arrangement overcomes the complexities and disadvantages associated with vacuum plasma processing, previously discussed above.

The pressure differential established across the first surface (123) and the second surface (124) propagates plasma generated from the plasma source (110) through the ink paths of the print head assembly (120) via the spigots (122) and nozzles (121). Plasma is preferably propagated from the nozzles (121) through to the spigots (122), but can alternatively be propagated from the spigots (122) through to the nozzles (121) by reversing the pressure differential (13). Two-way propagation of plasma, once from the nozzles (121) through to the spigots (122) and once from the spigots (122) through to the nozzles (121), may also be performed to ensure thorough activation of all internal surfaces in the print head assembly (120).

The setup (1000) further allows a treatment solution to be supplied to the nozzles (121) on the first surface (123) of the print head assembly (120) from either the first surface of the print head assembly or propagated through the spigots (122) to the nozzles (121) of the print head assembly. The pressure differential established by the suction pump is variable to effect both the propagation of plasma through the ink paths of the print head assembly (120), as well as the propagation of the treatment solution through the ink paths.

First Embodiment

Figure 2:
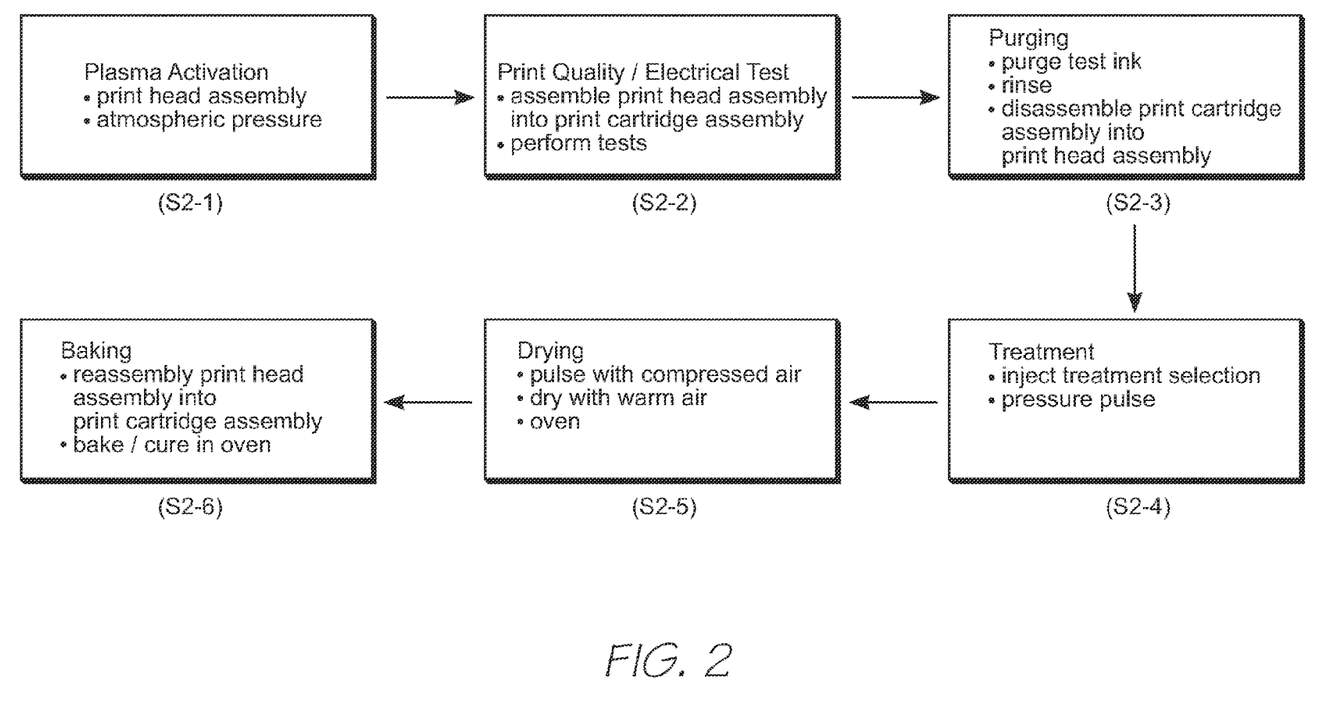
FIG. 2 is a flowchart illustrating a first embodiment of the present invention.

FIG. 2 is a flow chart illustrating the steps of a first embodiment of the hydrophilizing method of the present invention. A newly fabricated print head assembly is first subjected to a plasma activation process (S2-1). In the first embodiment, an $O_2$ plasma is used. The $O_2$ plasma activation process is performed with the print head assembly at atmospheric pressure.

An atmospheric plasma generating tool is preferably utilized as the plasma source, allowing the print head assembly to be maintained in an environment at or close to atmospheric pressure. Alternatively, an arrangement utilizing corona discharge directed at the print head assembly may be used.

Following the plasma activation process (S2-1), the activated print head assembly is packaged into a print cartridge assembly, whereupon it is primed with ink and the print cartridge assembly subjected to a print quality and electrical testing process (S2-2).

The activated surfaces of the print head assembly, having raised surface energies, facilitate the rapid ingress of ink into the fluidic channels of the print head assembly during the print quality and electrical testing process (S2-2). The ink used in the print quality and testing process comprises mostly of water, water soluble glycols, dyes and surfactants, and hence does not compromise the wetting character of the plasma activated surfaces. The print quality and electrical testing process (S2-2) utilising such ink therefore does not result in any significant deterioration in the hydrophilicity of the print head assembly generated through exposure to the plasma.

Purging of unused ink, post testing, and rinsing of the print head assembly with either an ink like vehicle comprising ink like components without a soluble dye, or water, with or without surfactants (S2-3), returns the print quality tested assembly to a condition that retains sufficient surface activation and hydrophilicity.

In an exemplary print quality and electrical testing process, an ink priming test and electrical test of the print cartridge assembly is performed. Then, the print cartridge assembly is washed with deionized water at 40 KPa through the back channels of the print head assembly, and the water vacuum extracted over 3 cycles at a reduced pressure of −40 KPa at ambient temperature.

Following the purging process (S2-3), the print head assembly is disassembled from the print cartridge assembly.

As previously mentioned, although the surfaces of the print head assembly are hydrophilic after the oxygen plasma activation process (S2-1), the activated surfaces relax over time and invariably return to a less-hydrophilic state. To prevent relaxation of the activated surfaces and loss of hydrophilicity, the first embodiment performs a treatment process (S2-4) on the surfaces of the print head assembly, whereby the internal, active surfaces of the print head assembly are exposed to an EPI treatment solution. The treatment process (S2-4) is performed after the purging process (S2-3).

The treatment process (S2-4) injects an EPI treatment solution though the ink paths of the print head assembly. The treatment solution may be injected through the spigots of the print head assembly to the nozzles, but is preferably injected from the nozzles to the spigots so as to also flush contaminants that may have accumulated from the print quality and electrical testing process (S2-2).

To ensure complete exposure of the print head assembly's internal structure to the treatment solution the ink channels of the assembly are blocked and/or subjected to a regime of pressure pulses. The pressure pulses cause a surge flow which dislodges any bubbles that may have been pinned during injection of the treatment solution. Pressure pulsing further compresses any such bubbles, thereby further aiding their release. The ink channels can be treated either collectively or individually for each colour channel. The treatment of individual colour channels allows for greater control over the process as variations in reagent flow can be monitored.

As EPI is supplied commercially as a concentrated solution in water, typically between 35 and 40%, a treatment solution containing EPI is preferably formed by further diluting the EPI concentrate with a compatible solvent. In the present embodiment, water is used as it is safe to handle (non-toxic, non-flammable), cheap and easy to dispose off. Furthermore, water does not deactivate high energy surfaces, has itself a high surface tension, and while volatile, does not dry too quickly. Overly quick drying of the EPI solution causes irretrievable blockages in the micro fluid structures of the print head assembly Propylene glycol, or other glycols and glycol ethers such as polyethylene glycol-300, with comparable volatility, may further be added to the EPI solution to slow down the drying rate of the EPI solution, allowing the EPI solution to stay fluid for the duration of the process.

An exemplary formulation (by percentage mass) of an EPI treatment solution is as follows:
  EPI (0.01% to 10%); typically 0.1%
  Propylene glycol (0.1% to 30%); typically 10%/Alternatively, Polyethylene glycol-300 (0.1%- to 30%); typically 10%
  Surfactant—e.g. Surfonyl (0.01% to 5%); typically 0.1%
  Water (remaining mass)

Following the treatment process (S2-4), the treated print head assembly is dried (S2-5).

In an exemplary drying process, purified compressed air is applied to each channel of the print head assembly at a pressure of 600 KPa. A pressure line is connected to the print head assembly via an on-off tap or stopcock, and the purified compressed air pulsed through the ink channels by rotating the tap. Since the passage of gas through the fluidic path of each channel is determined by the complexity of its structure and the degree of restriction offered by its smallest feature, pulsing the compressed air ensures that all of the treatment solution is purged from the fluidic path, including any accumulated excess fluid that may have pooled within the print head assembly's fluidic structure. The frequency and number of pulsing operations is determined based on the effective dryness of the purged print head. One to six cycles of 10 seconds duration per cycle was found to be effective, but the drying process is not so limited. All channels are subsequently blown through with warm air at 800 KPa for 10 minutes. The warm air is preferably generated by a vortex device, whereby the generated air is substantially free of contaminants. In the exemplary drying process, the print head assembly is finally placed in an oven at 70° C. for 2 or more hours, with the nozzles of the print head assembly pointing upwards.

The process of drying the treated print head substantially removes any water and propylene glycol introduced from the treatment solution. A non-volatile, highly wetting, thin film of EPI is left behind on the surfaces of the print head assembly.

As mentioned above, the treatment solution is a water based solution of an EPI concentrate. Solvation of EPI in water is achieved through hydrogen bonding interactions of water molecules with appropriate receptor sites, viz the ethoxy and/or amino functionalities of which EPI is comprised. To achieve adhesion of EPI to the hydrogen bonding sites on the activated surface of the print head assembly, however, the water molecules associated with solvation must be persuaded to leave the treatment solution and allow the hydroxyl groups at the activated surface to take their place. This is most effectively achieved through the thermal displacement of the solvent, i.e. baking.

Baking serves to drive off water molecules, while the excess thermal energy allows the EPI to more rapidly maximise its surface interaction and achieve a stable surface coating. Baking also helps to volatilize any residual propylene glycol left after the drying process. Accordingly, the dried print head assembly is reassembled into the print head cartridge and baked/cured in an oven (S2-6). Preferably, the print head cartridge is cured for 1 to 18 hours at approximately 70° C.

In the first embodiment, the treatment process (S2-4) and drying process (S2-5) are performed after the print quality and electrical testing process (S2-2). In this manner, the thin film of EPI left behind after the drying process (S2-5) is untouched and unaffected by any further processes.

Second Embodiment

Figure 3:
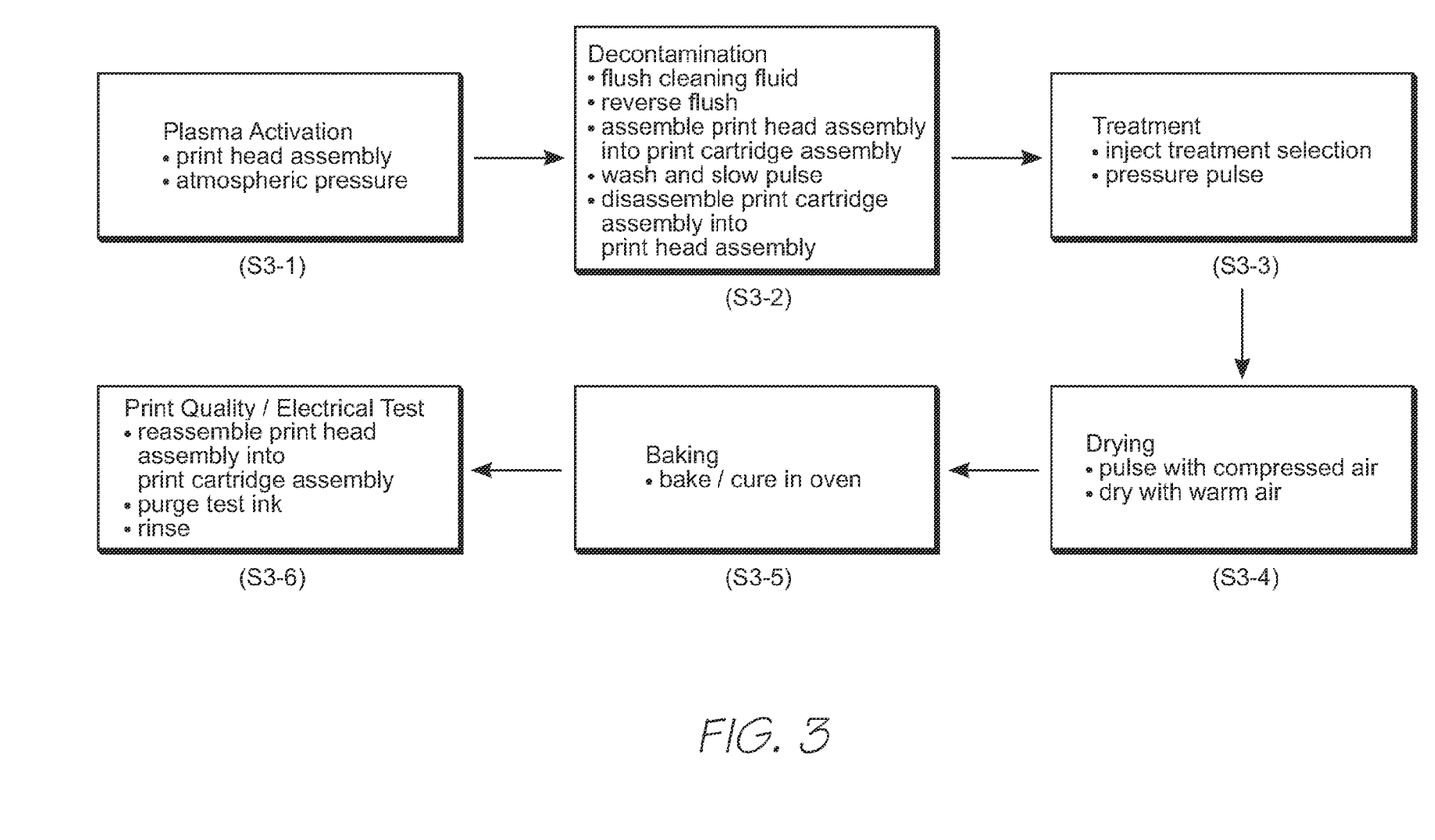
FIG. 3 is a flowchart illustrating a second embodiment of the present invention.

FIG. 3 is a flow chart illustrating the steps of a second embodiment of the hydrophilizing method of the present invention.

In the second embodiment, a newly fabricated printhead assembly is first subjected to a plasma activation process (S3-1). Similar to the first embodiment, an $O_2$ plasma is used. The plasma activation process (S3-1) is performed with the print head assembly at atmospheric pressure.

An atmospheric plasma generating tool is preferably utilized as the plasma source. Alternatively, an arrangement utilizing corona discharge directed at the print head assembly may be used.

Following activation of the print head assembly, (S3-1) a decontamination process (S3-2) is performed. The decontamination process (S3-2) flushes a cleaning fluid through the print head assembly.

Acceptable cleaning fluids include surfynol in deionized water, aqueous glycols and alcohols, other surfactants in deionized water, or a combination of such fluids. Common to these fluids are the characteristic of being water based, having good wetting characteristics, having low surface tension, solubilising of film forming contaminants, volatile (to facilitate rapid drying), and leaving only residues compatible with subsequent wet processing. The cleaning fluids used should further be benign to the print head assembly material (including glue joints and encapsulants), and preferably be non-toxic, cheap, readily available, and recyclable after filtration.

Due to the dendritic structure of channels within the print head assembly, the ink paths (for example, ink supply channels) from the back of the print head assembly gradually decrease in size towards the front of the print head assembly (for example ink nozzles, and nozzle feed channels). The cleaning fluid is therefore reverse flushed from the nozzles on a front face of the print head assembly, out through the spigots on a back face. Reverse flushing ensures that the particles of contamination are propagated into channels of ever increasing size. In this manner, the particles of contamination are not trapped in the ink paths, and do not block or become lodged in the narrower portions of the ink path.

In an exemplary decontamination process (S3-2), a reverse flush is performed at 200 ml/min for 200 seconds at 45° C. The print head assembly is then assembled to form a print cartridge assembly, and the print cartridge assembly washed using a slow pulse of a solution of glycerol and ethylene glycol in water with a soupcon of surfynol for 3 cycles, at 3-5 KPa, followed by one 6 second pulse at 80 KPa. The print cartridge assembly is subsequently disassembled back into a print head assembly.

Following the decontamination process (S3-2), a treatment process (S3-3) using a treatment solution of EPI is performed on the print head assembly.

The treatment process (S3-3) injects the treatment solution though the ink paths of the print head assembly. The treatment solution may be injected from the spigots of the print head assembly to the nozzles, but is preferably injected from the nozzles to the spigots so as to also flush contaminants that may have accumulated in the ink paths. To ensure complete exposure of the print head assembly's internal structure to the treatment solution the ink channels of the assembly are blocked and/or subjected to a regime of pressure pulses. The pressure pulses cause a surge flow which dislodges any bubbles that may have been pinned during injection of the treatment solution. Pressure pulsing further compresses any such bubbles, thereby further aiding their release. The ink channels can be treated either collectively or individually for each colour. The treatment of individual colour channels allows for greater control over the process as variations in reagent flow can be monitored.

As with the first embodiment, the treatment solution of EPI is preferably formed by diluting an EPI concentrate with a compatible solvent. Propylene glycol may further be added to the EPI solution to slow down the drying rate of the EPI solution, allowing the EPI solution to stay fluid for the duration of the process.

A drying process (S3-4) is performed after the treatment process (S3-3). In an exemplary drying process, purified compressed air is applied to each channel of the print head assembly at a pressure of 600 KPa. A pressure line is connected to the print head assembly via an on-off tap or stopcock, and the purified compressed air pulsed through the ink channels by rotating the tap. Since the passage of gas through the fluidic path of each channel is determined by the complexity of it structure and the degree of restriction offered by its smallest feature, pulsing the compressed air ensures that all of the treatment solution is purged from the fluidic path, including any accumulated excess fluid that may have pooled within the print head assembly's fluidic structure.

The frequency and number of pulsing operations is determined based on the effective dryness of the purged print head. One to six cycles of 10 seconds duration per cycle was found to be effective, but the drying process is not so limited. All channels are subsequently blown through with warm air at 800 KPa for 10 minutes. The warm air is preferably generated by a vortex device, whereby the generated air is substantially free of contaminants. In the exemplary drying process, the print head assembly is finally placed in an oven at 70° C. for 2 or more hours, with the nozzles of the print head assembly pointing upwards.

The process of drying the treated print head removes any water and propylene glycol introduced by the treatment solution. A non-volatile, highly wetting, thin film of EPI is left behind on the surfaces of the print head assembly.

As previously mentioned, the treatment solution is a water based solution of an EPI concentrate. Solvation of EPI in water is achieved through hydrogen bonding interactions of water molecules with appropriate receptor sites, viz the ethoxy and/or amino functionalities of which EPI is comprised. To achieve adhesion of EPI to the hydrogen bonding sites on the activated surface of the print head assembly, however, the water molecules associated with solvation must be persuaded to leave the treatment solution and allow the hydroxyl groups at the activated surface to take their place. This is most effectively achieved through the thermal displacement of the solvent, i.e. baking.

Baking serves to drive off water molecules, while the excess thermal energy allows the EPI to more rapidly maximise its surface interaction and achieve a stable surface coating. Baking also helps to volatilize any residual propylene glycol left after the drying process. Accordingly, the dried print head assembly is reassembled into the print head cartridge, and baked/cured in an oven (S3-5). Preferably, the print head cartridge is cured for 1 to 18 hours at approximately 70° C.

A print quality and electrical testing process (S3-6) similar to that described in the first embodiment at (S2-2) is performed next on the print cartridge assembly, and the print cartridge assembly allowed to sit for a day to dry.

The second embodiment, as compared to the first embodiment, includes an additional decontamination process (S3-2) performed after the plasma activation process (S3-1), but before the treatment process (S3-3). The decontamination process removes particulate contamination and film forming debris from the internal surfaces of the print head assembly. In this manner, a more efficient and thorough treatment of the internal surfaces is realized.

Further, in the second embodiment, the print quality and electrical testing process (S3-6) is performed after the treatment process (S3-3) and the drying process (S3-4). While the passing of ink through the print head assembly during the print quality and electrical testing process (S3-6) will dissolve some of the thin film EPI coating the internal surfaces, the rate of dissolution of the thin film is slow, and the time taken to print, test, wash and clean is short in comparison to the time needed to completely dissolve the thin film.

An advantage of performing the treatment process (S3-3) before the print quality and electrical testing process (S3-6), however, is that the treatment process (S3-3) is performed on freshly decontaminated surfaces that have not been exposed to any other substances, such as the inks and flushing fluids used during the print quality and electrical testing process (S3-6). In this manner, a more thorough and efficient treatment of the surfaces is realized.

Third Embodiment

Figure 4:
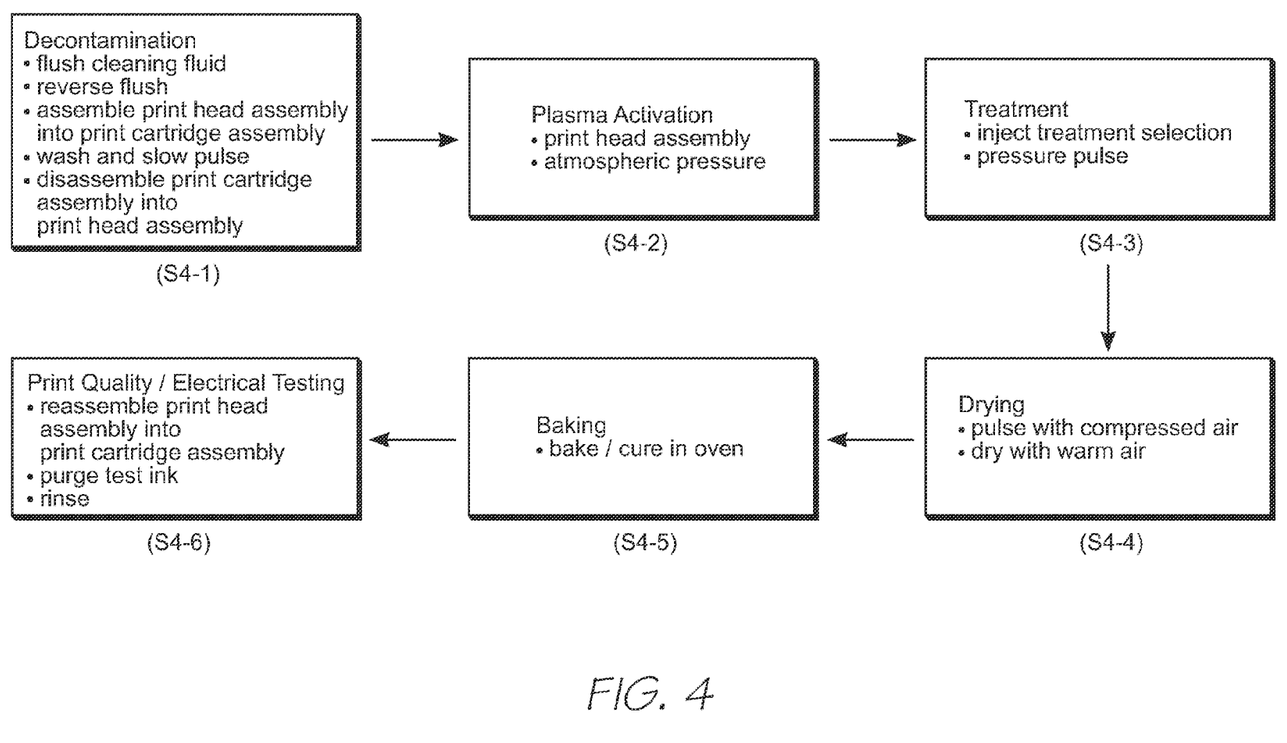
FIG. 4 is a flowchart illustrating a third embodiment of the present invention.

FIG. 4 is a flow chart illustrating a third embodiment of the hydrophilizing method of the present invention.

In the third embodiment, a print head assembly is subjected first to a decontamination process (S4-1). The decontamination process (S4-1) reverse flushes a cleaning fluid through the print head assembly. A reverse flush is performed for reasons as described above in the second embodiment.

It is particularly important in the third embodiment to have no residues left on the internal surfaces of the print head assembly after the decontamination process (S4-1), since a later step of plasma activation in the third embodiment will by default activate any material the plasma comes into contact with, no matter what this material is, including surfactant residues left behind by the cleaning fluids. The internal surfaces of the assembly should also be completely dried before plasma activation, since residual water, or any fluid, would mask the surface from the plasma species passing over it. While an activated surfactant residue would very likely be highly wetting, a subsequent process of treatment to be performed in the third embodiment might well be compromised.

To leave a truly decontaminated, residue free surface, the cleaning fluid should contain no non-volatile components, and to facilitate drying is preferably readily removed upon exposure to heat. In the third embodiment, therefore, a solvent is used in place of a surfactant, as the cleaning fluid.

Aqueous ethanol is a particularly effective solvent satisfying the above requirements. Propan-1-ol, would also be an effective solvent. Aqueous ethanol has a lower surface tension than water alone and is therefore more wetting. Furthermore, ethanol is a good solvent, evaporates easily, is cheap, relatively safe when diluted, non-toxic and readily available in pure form. Therefore, the third embodiment of the present invention preferably reverse flushes aqueous ethanol as a cleaning fluid in the decontamination process (S4-1).

The cleaning fluid of aqueous ethanol is subsequently thoroughly dried off, thereby completing the decontamination process (S4-1). In an exemplary decontamination process, the print head assembly is vacuum dried in oven at approximately 70° C. for 2 hours.

Following the decontamination process (S4-1), the printhead assembly is subjected to a plasma activation process (S4-2). Similar to the first embodiment, an $O_2$ plasma is used. The plasma activation process is performed with the print head assembly at atmospheric pressure.

An atmospheric plasma generating tool is preferably utilized as the plasma source, allowing the print head assembly to be maintained in an environment at or close to atmospheric pressure. Alternatively, an arrangement utilizing corona discharge directed at, or drawn through the print head assembly may be used.

Following the plasma activation process (S4-2), the print head assembly is subjected to a treatment process (S4-3) using a treatment solution of EPI.

The treatment process (S4-3) injects the treatment solution though the ink paths of the print head assembly. The treatment solution may be injected the spigots of the print head assembly to the nozzles, but is preferably injected from the nozzles to the spigots so as to also flush contaminants that may have accumulated in the ink paths. To ensure complete exposure of the print head assembly's internal structure to the treatment solution the ink channels of the assembly are blocked and/or subjected to a regime of pressure pulses. The pressure pulses cause a surge flow which dislodges any bubbles that may have been pinned during injection of the treatment solution. Pressure pulsing further compresses any such bubbles, thereby further aiding their release. The ink channels can be treated either collectively or individually for each colour. The treatment of individual colour channels allows for greater control over the process as variations in reagent flow can be monitored.

As with the first embodiment, the treatment solution of EPI is preferably formed by diluting an EPI concentrate with a compatible solvent such as water. Propylene glycol is further preferably added to the EPI solution to slow down the drying rate of the EPI solution, allowing the EPI solution to stay fluid for the duration of the process.

The treated print head assembly is then dried (S4-4). In an exemplary drying process, purified compressed air, free of particulate contamination is applied to each channel of the print head assembly at a pressure of 600 KPa. A pressure line is connected to the print head assembly via an on-off tap or stopcock, and the purified compressed air pulsed through the ink channels by rotating the tap. Since the passage of gas through the fluidic path of each channel is determined by the complexity of it structure and the degree of restriction offered by its smallest feature, pulsing the compressed air ensures that all of the treatment solution is purged from the fluidic path, including any accumulated excess fluid that may have pooled within the print head assembly's fluidic structure.

The frequency and number of pulsing operations is determined based on the effective dryness of the purged print head. One to six cycles of 10 seconds duration per cycle was found to be effective, but the drying process is not so limited. All channels are subsequently blown through with warm air at or around 40° C. at 800 KPa for 10 minutes. The warm air is preferably generated by a vortex device, whereby the generated air is substantially free of contaminants.

Following the drying process (S4-4), the print head assembly is baked/cured (S4-5) in an oven at approximately 70° C. for 1 to 18 hours (S4-5). As previously mentioned, baking serves to drive off water molecules while the excess thermal energy allows the EPI to more rapidly maximise its surface interaction and achieve a stable surface coating. Baking also helps to volatilize any residual propylene glycol left after the drying process.

Following the baking process (S4-5), the print head assembly is assembled as a print cartridge assembly, and tested for print quality and electrical connections (S4-6). The print quality and electrical testing process is similar to that described in the first embodiment at (S2-2).

In the third embodiment, the decontamination process (S4-1) is performed as one of the first steps of the hydrophilizing method. By performing the decontamination process (S4-1) before the plasma activation process (S4-2), the internal surfaces of the print head assembly are better exposed to the plasma, and accordingly more complete and optimal surface activation is realized. In particular, particulates or films that might otherwise mask critical areas of the internal structure are removed before the internal surfaces are activated.

In contrast to the first and second embodiments, in which a plasma activation process is performed before a decontamination process, the presence of non-activated surface patches that are less receptive to treatment is significantly reduced.

Further, in the third embodiment, the treatment process (S4-3) is performed effectively immediately after the plasma activation process (S4-2). In this manner, the activated surfaces of the print head assembly are given less time to relax as compared to the first and second embodiments, and are maintained near their most energetic states. Moreover, as the print head assembly is made up of a composite of materials, each having different relaxation times, the sooner the treatment process is performed after the plasma activation process, the more uniform the surface energy of the different materials making up the print head assembly will remain.

Still further, compared to the second embodiment, by performing the treatment process (S4-3) immediately after the plasma activation process (S4-2) instead of intervening a decontamination process therebetween, the treatment process (S4-3) is performed on a freshly activated surface that has not been exposed to other substances, such as those used in the decontamination process (S4-1).

Similar to the second embodiment, the print quality and electrical testing process (S4-6) is performed after the treatment process (S4-3). While the passing of ink through the print head assembly during the print quality and electrical testing process (S4-6) will dissolve some of the thin film EPI coating the internal surfaces, the rate of dissolution of the thin film is slow, and the time taken to print, test, wash and clean is short in comparison to the time needed to completely dissolve the thin film.

As with the second embodiment, the advantage of performing the treatment process (S4-3) before the print quality and electrical testing process (S4-6) is that the treatment process (S4-3) is performed on freshly decontaminated surfaces that have not been exposed to any other substances, such as the inks and flushing fluids used during the print quality and electrical testing process (S4-6). Accordingly, an even more efficient and thorough treatment of the surfaces is realized.

Post-Processing Packaging and Shipping

The surfaces of a print head assembly plasma activated and treated according to the disclosed embodiments above are coated with a non-volatile, highly wetting, thin film of EPI that inhibits relaxation of the activated surfaces.

The EPI thin film provides a relaxation inhibiting effect similar to priming the print head assembly with ink, or an ink like fluid, after fabrication, and ensuring the print head assembly remains primed with ink or an ink like fluid until use (hereinafter referred to as "wet shipping"), as discussed previously in the background section, without the complexities and inefficiencies associated with wet shipping.

Wet shipping print head assemblies require the print head assemblies to be packed in waterproof, perfectly sealed bags. Wet shipping print head assemblies are intolerant to any deterioration of the sealed environment, and are further susceptible to ink spillage. In contrast, the non-volatile, highly-wetting EPI thin film coating the surfaces of a print head assembly processed by the disclosed embodiments are macroscopically dry. Accordingly, special packing and sealing requirements are not necessary.

In a further embodiment of the present invention, therefore, print head assemblies are packaged using more cost efficient packaging than is required for the wet shipping of a print head assembly. Examples of such packaging include lower grade vacuum packaging, and shrink wrapping.

In a still further embodiment, the print head assemblies are pre-installed in respective printers, and stored and transported with the printer. The print head assemblies are stored and transported in a manner insensitive to orientation, allowing for more spatial and time efficient handling of the print head assemblies throughout the logistics chain, and accordingly, significant cost savings. Storage, transport, and sale of print head assemblies in this manner are possible since ink spillage from the print head assemblies during these stages of the logistical chain is entirely prevented.

Moreover, compliance with import/export regulations, shipping classifications, customs classifications, and other legal and procedural complexities involved with the transport of liquids are obviated. Provision of a true "Plug and Play" printing system is also realized Examples of further aspects of the disclosed invention are presented in the following paragraphs:

1. A method for hydrophilizing surfaces of a printhead assembly, the method comprising steps of:
   plasma activating the surfaces of the printhead assembly;
   treating the surfaces of the printhead assembly with a treatment solution;
   drying the printhead assembly; and
   baking the printhead assembly.

2. A method according to paragraph 1, wherein the step of plasma activating the surfaces of the printhead assembly is performed with the printhead assembly at atmospheric pressure.

3. A method according to paragraph 1, wherein the step of plasma activating the surfaces of the printhead assembly uses an oxygen plasma.

4. A method according to paragraph 1, further comprising a step of performing a print quality and electrical test on the printhead assembly;

5. A method according to paragraph 4, further comprising a step of assembling the printhead assembly into a printhead cartridge before performing the print quality and electrical test.

6. A method according to paragraph 4, wherein the step of performing the print quality and electrical test comprises a step of purging unused ink from the printhead assembly.

7. A method according to paragraph 4, wherein the step of performing the print quality and electrical test comprises a step of rinsing the printhead assembly.

8. A method according to paragraph 5, further comprising a step of disassembling the printhead cartridge into the printhead assembly after the print quality and electrical test and before the step of treating the surfaces of the printhead assembly with a treatment solution.

9. A method according to paragraph 1, wherein the step of plasma activating includes a first propagation of plasma through ink pathways of the printhead assembly, from a nozzle-side of the printhead assembly through to an ink-supply-side of the printhead assembly.

10. A method according to paragraph 8, wherein the step of plasma activating further includes a second propagation of plasma through the ink pathways of the printhead assembly, from the ink-supply-side of the printhead assembly through to the nozzle-side of the printhead assembly.

11. A method according to paragraph 10, wherein the first propagation is performed before the second propagation.

12. A method according to paragraph 1, wherein the step of treating the surfaces of the printhead assembly injects an ethoxylated polyethyleneimine (EPI) solution through ink pathways of the printhead assembly.

13. A method according to paragraph 1, wherein the step of treating the surfaces of the printhead assembly injects the treatment solution through ink pathways of the printhead assembly from a nozzle-side of the printhead assembly through to an ink-supply-side of the printhead assembly.

14. A method according to paragraph 1, wherein the step of treating the surfaces of the printhead assembly includes blocking an ink-supply-side of the printhead assembly and pressure pulsing the treatment solution through the printhead assembly from a nozzle-side of the printhead assembly.

15. A method according to paragraph 1, further comprising a step of diluting the treatment solution with propylene glycol.

16. A method according to paragraph 1, wherein the step of drying the printhead assembly supplies purified compressed air through ink pathways of the printhead assembly.

17. A method according to paragraph 16, wherein the purified compressed air is supplied at a pressure of 600 kPa.

18. A method according to paragraph 16, wherein the purified compressed air is pulsed through the ink pathways of the printhead assembly.

19. A method according to paragraph 18, wherein the purified compressed air is pulsed through the ink pathways of the printhead assembly for one to six cycles.

20. A method according to paragraph 19, wherein each cycle is approximately 10 seconds in duration.

21. A method according to paragraph 16, wherein the step of drying the printhead assembly further supplies warm air through the ink pathways of the printhead assembly at a pressure of 800 kPa for 10 minutes.

22. A method according to paragraph 1, wherein the step of baking the printhead assembly includes assembling the printhead assembly into a printhead cartridge, and baking the printhead cartridge in an oven.

23. A method according to paragraph 22, wherein the printhead cartridge is baked at 70° C.

24. A method according to paragraph 1, wherein the step of performing the print quality and electrical test is performed before the steps of treating the surfaces of the printhead assembly and drying the printhead assembly.

25. A method for hydrophilizing surfaces of a printhead assembly, the method comprising steps of:
   plasma activating the surfaces of the printhead assembly;
   decontaminating the printhead assembly;
   treating the surfaces of the printhead assembly with a treatment solution;
   drying the printhead assembly; and
   baking the printhead assembly.

26. A method according to paragraph 25, wherein the step of plasma activating the surfaces of the printhead assembly is performed with the printhead assembly at atmospheric pressure.

27. A method according to paragraph 25, wherein the step of plasma activating the surfaces of the printhead assembly uses an oxygen plasma.

28. A method according to paragraph 25, further comprising a step of performing a print quality and electrical test on the printhead assembly.

29. A method according to paragraph 28, further comprising a step of assembling the printhead assembly into a printhead cartridge before performing the print quality and electrical test.

30. A method according to paragraph 28, wherein the step of performing the print quality and electrical test comprises a step of purging unused ink from the printhead assembly.

31. A method according to paragraph 28, wherein the step of performing the print quality and electrical test comprises a step of rinsing the printhead assembly.

32. A method according to paragraph 29, further comprising a step of disassembling the printhead cartridge into the printhead assembly after the print quality and electrical test and before the step of treating the surfaces of the printhead assembly with a treatment solution.

33. A method according to paragraph 25, wherein the step of plasma activating includes a first propagation of plasma through ink pathways of the printhead assembly, from a nozzle-side of the printhead assembly through to an ink-supply-side of the printhead assembly.

34. A method according to paragraph 33, wherein the step of plasma activating further includes a second propagation of plasma through the ink pathways of the printhead assembly, from the ink-supply-side of the printhead assembly through to the nozzle-side of the printhead assembly.

35. A method according to paragraph 34, wherein the first propagation is performed before the second propagation.

36. A method according to paragraph 25, wherein the step of treating the surfaces of the printhead assembly injects an ethoxylated polyethyleneimine (EPI) solution through ink pathways of the printhead assembly.

37. A method according to paragraph 25, wherein the step of treating the surfaces of the printhead assembly injects the treatment solution through ink pathways of the printhead assembly from a nozzle-side of the printhead assembly through to an ink-supply-side of the printhead assembly.

38. A method according to paragraph 25, wherein the step of treating the surfaces of the printhead assembly includes blocking an ink-supply-side of the printhead assembly and pressure pulsing the treatment solution through the printhead assembly from a nozzle-side of the printhead assembly.

39. A method according to paragraph 25, further comprising a step of diluting the treatment solution with propylene glycol.

40. A method according to paragraph 25, wherein the step of drying the printhead assembly supplies purified compressed air through ink pathways of the printhead assembly.

41. A method according to paragraph 40, wherein the purified compressed air is supplied at a pressure of 600 kPa.

42. A method according to paragraph 40, wherein the purified compressed air is pulsed through the ink pathways of the printhead assembly.

43. A method according to paragraph 42, wherein the purified compressed air is pulsed through the ink pathways of the printhead assembly for one to six cycles.

44. A method according to paragraph 43, wherein each cycle is approximately 10 seconds in duration.

45. A method according to paragraph 40, wherein the step of drying the printhead assembly further supplies warm air through the ink pathways of the printhead assembly at a pressure of 800 kPa for 10 minutes.

46. A method according to paragraph 25, wherein the step of baking the printhead assembly includes assembling the printhead assembly into a printhead cartridge, and baking the printhead cartridge in an oven.

47. A method according to paragraph 46, wherein the printhead cartridge is baked at 70° C.

48. A method according to paragraph 25, wherein the step of decontaminating the printhead assembly flushes a cleaning fluid through the printhead assembly.

49. A method according to paragraph 48, wherein the cleaning fluid is selected from the group consisting of: surfynol in deionized water, aqueous glycols, alcohols, a surfactant in deionized water, and a combination of such fluids.

50. A method according to paragraph 48, wherein the step of decontaminating the printhead assembly flushes the cleaning fluid from a nozzle-side of the printhead assembly through to an ink-supply-side of the printhead assembly.

51. A method according to paragraph 48, wherein the cleaning fluid is flushed through the printhead assembly at a rate of 200 milliliters per minute for 200 seconds at 45° C.

52. A method according to paragraph 48, wherein the step of decontaminating the printhead assembly further includes steps of assembling the printhead assembly into a printhead cartridge, and washing the printhead cartridge in a solution of glycerol and ethylene glycol.

53. A method according to paragraph 52, wherein the solution of glycerol and ethylene glycol is pulsed through the printhead cartridge with surfynol for 3 cycles at between 3 to 5 kPa, followed by a 6 second pulse at 80 kPa.

54. A method according to paragraph 53, further including a step of disassembling the printhead cartridge into the printhead assembly after completion of the decontamination step.

55. A method according to paragraph 25, wherein the step of decontaminating the printhead assembly is performed after the step of plasma activating the printhead assembly.

56. A method according to paragraph 25, wherein the step of decontaminating the printhead assembly is performed before the step of treating the surfaces of the printhead assembly.

57. A method according to paragraph 28, wherein the step of treating the surfaces of the printhead assembly with a treatment solution is performed before the step of performing a print quality and electrical test on the printhead assembly.

58. A method for hydrophilizing surfaces of a printhead assembly, the method comprising steps of:
    decontaminating the printhead assembly;
    plasma activating the surfaces of the printhead assembly;
    treating the surfaces of the printhead assembly with a treatment solution;
    drying the printhead assembly; and
    baking the printhead assembly, wherein
    the step of decontaminating the printhead assembly is performed before the step of plasma activating the surfaces of the printhead assembly.

59. A method according to paragraph 58, wherein the step of plasma activating the surfaces of the printhead assembly is performed with the printhead assembly at atmospheric pressure.

60. A method according to paragraph 58, wherein the step of plasma activating the surfaces of the printhead assembly uses an oxygen plasma.

61. A method according to paragraph 58, further comprising a step of performing a print quality and electrical test on the printhead assembly.

62. A method according to paragraph 61, further comprising a step of assembling the printhead assembly into a printhead cartridge before performing the print quality and electrical test.

63. A method according to paragraph 61, wherein the step of performing the print quality and electrical test comprises a step of purging unused ink from the printhead assembly.

64. A method according to paragraph 61, wherein the step of performing the print quality and electrical test comprises a step of rinsing the printhead assembly.

65. A method according to paragraph 61, further comprising a step of disassembling the printhead cartridge into the printhead assembly after the print quality and electrical test and before the step of treating the surfaces of the printhead assembly with a treatment solution.

66. A method according to paragraph 58, wherein the step of plasma activating includes a first propagation of plasma through ink pathways of the printhead assembly, from a nozzle-side of the printhead assembly through to an ink-supply-side of the printhead assembly.

67. A method according to paragraph 66, wherein the step of plasma activating further includes a second propagation of plasma through the ink pathways of the printhead assembly, from the ink-supply-side of the printhead assembly through to the nozzle-side of the printhead assembly.

68. A method according to paragraph 67, wherein the first propagation is performed before the second propagation.

69. A method according to paragraph 58, wherein the step of treating the surfaces of the printhead assembly injects an ethoxylated polyethyleneimine (EPI) solution through ink pathways of the printhead assembly.

70. A method according to paragraph 58, wherein the step of treating the surfaces of the printhead assembly injects the treatment solution through ink pathways of the printhead assembly from a nozzle-side of the printhead assembly through to an ink-supply-side of the printhead assembly.

71. A method according to paragraph 58, wherein the step of treating the surfaces of the printhead assembly includes blocking an ink-supply-side of the printhead assembly and pressure pulsing the treatment solution through the printhead assembly from a nozzle-side of the printhead assembly.

72. A method according to paragraph 58, further comprising a step of diluting the treatment solution with propylene glycol.

73. A method according to paragraph 58, wherein the step of drying the printhead assembly supplies purified compressed air through ink pathways of the printhead assembly.

74. A method according to paragraph 73, wherein the purified compressed air is supplied at a pressure of 600 kPa.

75. A method according to paragraph 73, wherein the purified compressed air is pulsed through the ink pathways of the printhead assembly.

76. A method according to paragraph 75, wherein the purified compressed air is pulsed through the ink pathways of the printhead assembly for one to six cycles.

77. A method according to paragraph 76, wherein each cycle is approximately 10 seconds in duration.

78. A method according to paragraph 73, wherein the step of drying the printhead assembly further supplies warm air through the ink pathways of the printhead assembly at a pressure of 800 kPa for 10 minutes.

79. A method according to paragraph 58, wherein the step of baking the printhead assembly includes assembling the printhead assembly into a printhead cartridge, and baking the printhead cartridge in an oven.

80. A method according to paragraph 79, wherein the printhead cartridge is baked at 70° C.

81. A method according to paragraph 58, wherein the step of decontaminating the printhead assembly flushes a cleaning fluid through the printhead assembly.

82. A method according to paragraph 81, wherein the cleaning fluid is selected from the group consisting of: surfynol in deionized water, aqueous glycols, alcohols, a surfactant in deionized water, and a combination of such fluids.

83. A method according to paragraph 81, wherein the step of decontaminating the printhead assembly flushes the cleaning fluid from a nozzle-side of the printhead assembly through to an ink-supply-side of the printhead assembly.

84. A method according to paragraph 81, wherein the cleaning fluid is flushed through the printhead assembly at a rate of 200 milliliters per minute for 200 seconds at 45° C.

85. A method according to paragraph 81, wherein the step of decontaminating the printhead assembly further includes steps of assembling the printhead assembly into a printhead cartridge, and washing the printhead cartridge in a solution of glycerol and ethylene glycol.

86. A method according to paragraph 85, wherein the solution of glycerol and ethylene glycol is pulsed through the printhead cartridge with surfynol for 3 cycles at between 3 to 5 kPa, followed by a 6 second pulse at 80 kPa.

87. A method according to paragraph 85, further including a step of disassembling the printhead cartridge into the printhead assembly after completion of the decontamination step.

88. A method according to paragraph 58, wherein the step of treating the surfaces of the printhead assembly with a treatment solution is performed directly after the step of the step of plasma activating the surfaces of the printhead assembly.

89. A method according to paragraph 58, wherein the step of treating the surfaces of the printhead assembly with a treatment solution is performed before the step of performing a print quality and electrical test on the printhead assembly.

90. A printhead assembly hydrophilization system, comprising:
a plasma source supplying plasma;
a plasma receiving area in which a printhead assembly is received, the plasma receiving area being substantially held at atmospheric pressure; and
a pump for establishing a pressure differential across the plasma receiving area, wherein
the plasma source supplies plasma to the plasma receiving area, and
the pressure differential established by the pump propagates the plasma across the plasma receiving area and through the printhead assembly received in the plasma receiving area.

91. A system as claimed in paragraph 90, wherein the plasma source is an atmospheric plasma generating device.

92. A system as claimed in paragraph 90, wherein the plasma source is a corona discharge device.

93. A system as claimed in paragraph 90 wherein the pump is further operable to propagate an aqueous treatment solution through the printhead assembly.

Although the invention has been described herein with reference to a number of specific embodiments, it will be appreciated by those skilled in the art that the invention is not limited only to the disclosed embodiments, and that these embodiments described a best-mode/preferred embodiment, whereas the invention may be embodied in other forms encompassed within the scope of this invention.

The invention claimed is:

1. A method for hydrophilizing surfaces of a printhead assembly, the method comprising steps of:
plasma activating the surfaces of the printhead assembly at atmospheric pressure;
treating the surfaces of the printhead assembly with a treatment solution;
drying the printhead assembly; and
baking the printhead assembly,
wherein the step of plasma activating includes a first propagation of plasma through ink pathways of the printhead assembly, from a nozzle-side of the printhead assembly through to an ink-supply-side of the printhead assembly and a second propagation of plasma through the ink pathways of the printhead assembly, from the ink-supply-side of the printhead assembly through to the nozzle-side of the printhead assembly.

2. A method according to claim 1, wherein the step of plasma activating the surfaces of the printhead assembly uses an oxygen plasma.

3. A method according to claim 1, further comprising a step of performing a print quality and electrical test on the printhead assembly.

4. A method according to claim 3, further comprising a step of assembling the printhead assembly into a printhead cartridge before performing the print quality and electrical test.

5. A method according to claim 4, further comprising a step of disassembling the printhead cartridge into the printhead assembly after the print quality and electrical test and before the step of treating the surfaces of the printhead assembly with the treatment solution.

6. A method according to claim 3, wherein the step of performing the print quality and electrical test comprises a step of purging unused ink from the printhead assembly.

7. A method according to claim 3, wherein the step of performing the print quality and electrical test comprises a step of rinsing the printhead assembly.

8. A method according to claim 3, wherein the step of performing the print quality and electrical test is performed before the steps of treating the surfaces of the printhead assembly and drying the printhead assembly.

9. A method according to claim 1, wherein the first propagation is performed before the second propagation.

10. A method according to claim 1, wherein the step of treating the surfaces of the printhead assembly injects an ethoxylated polyethyleneimine (EPI) solution through the ink pathways of the printhead assembly.

11. A method according to claim 1, wherein the step of treating the surfaces of the printhead assembly includes blocking the ink-supply-side of the printhead assembly and pressure pulsing the treatment solution through the printhead assembly from the nozzle-side of the printhead assembly.

12. A method according to claim 1, further comprising a step of diluting the treatment solution with propylene glycol.

13. A method according to claim 1, wherein the step of drying the printhead assembly supplies purified compressed air through the ink pathways of the printhead assembly.

14. A method according to claim 13, wherein the purified compressed air is supplied at a pressure of 600 kPa.

15. A method according to claim 13, wherein the purified compressed air is pulsed through the ink pathways of the printhead assembly.

16. A method according to claim 1, wherein the step of baking the printhead assembly includes assembling the printhead assembly into a printhead cartridge, and baking the printhead cartridge in an oven.

\* \* \* \* \*